United States Patent
Liu et al.

(10) Patent No.: US 7,364,836 B2
(45) Date of Patent: *Apr. 29, 2008

(54) DUAL DAMASCENE PROCESS

(75) Inventors: Chung-Shi Liu, Hsin-Chu (TW); Chih-Cheng Lin, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 350 days.

This patent is subject to a terminal disclaimer.

(21) Appl. No.: 11/193,901

(22) Filed: Jul. 29, 2005

(65) Prior Publication Data

US 2005/0277277 A1   Dec. 15, 2005

Related U.S. Application Data

(63) Continuation of application No. 09/689,930, filed on Oct. 13, 2000, now Pat. No. 6,962,771.

(51) Int. Cl.
   *G03F 7/00* (2006.01)
(52) U.S. Cl. ............... 430/311; 430/313; 430/317; 438/597
(58) Field of Classification Search ........... 430/317, 430/313
   See application file for complete search history.

(56) References Cited

U.S. PATENT DOCUMENTS

| 4,770,739 | A | 9/1988 | Orvek et al. |
| 5,843,847 | A | 12/1998 | Pu et al. |
| 5,877,075 | A | 3/1999 | Dai et al. |
| 5,877,076 | A | 3/1999 | Dai |
| 5,882,996 | A | 3/1999 | Dai |
| 5,906,911 | A | 5/1999 | Cote |
| 5,936,707 | A | 8/1999 | Nguyen et al. |
| 6,103,456 | A | 8/2000 | Tobben et al. |
| 6,110,648 | A | 8/2000 | Jang |
| 6,962,771 | B1 * | 11/2005 | Liu et al. .............. 430/317 |

\* cited by examiner

*Primary Examiner*—Mark F. Huff
*Assistant Examiner*—Caleen O. Sullivan
(74) *Attorney, Agent, or Firm*—Haynes Boone, LLP

(57) ABSTRACT

A method of photoresist processing includes forming a first photoresist layer over composite layers of dielectric insulation and a top insulating layer and patterning a via hole pattern in the first photoresist layer by exposing to radiation of a first sensitivity. A second photoresist layer is formed over via patterned and the first photoresist layer. A trench line pattern is formed in the second photoresist layer by exposing to radiation of a second sensitivity. The layers are then etched and the trench line and via hole openings are filled with metal.

20 Claims, 2 Drawing Sheets

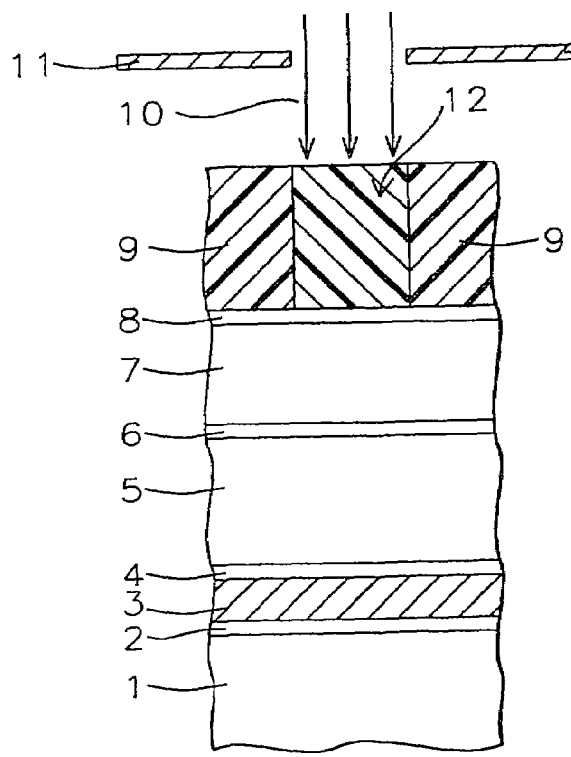
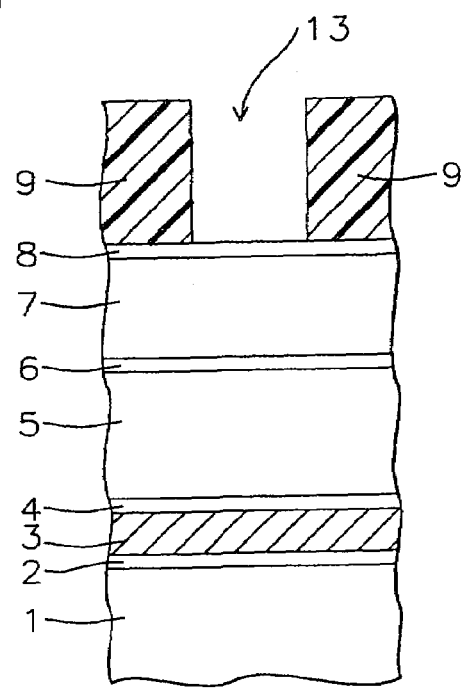
FIG. 1A
FIG. 1B
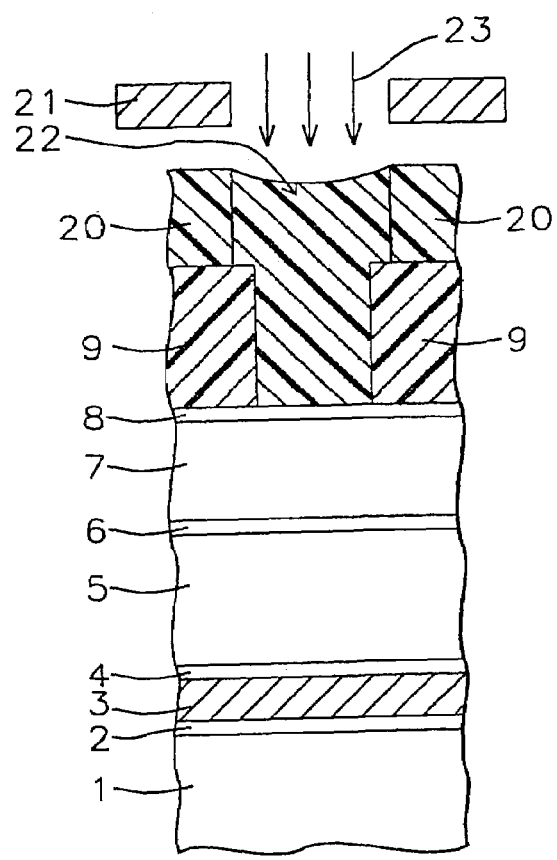
FIG. 2A

US 7,364,836 B2

DUAL DAMASCENE PROCESS

RELATED APPLICATIONS

This application is a continuation application of U.S. application Ser. No. 09/689,930 filed Oct. 13, 2000 entitled, "Dual Damascene Process".

BACKGROUND OF THE INVENTION

This invention relates to a method of fabrication used for semiconductor integrated circuit devices, and more specifically, to the formation of self-aligned dual damascene interconnects and vias, which incorporates two positive photoresist systems, which have different wavelength sensitivities, to form trench/via openings with only a two-step etching process.

DESCRIPTION OF RELATED ART

It remains a challenge in dual damascene processing to develop simplified processing with fewer processing steps, both photo and etch steps, to achieve the trench/via patterning and formation of trench and via openings.

As background, the damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices.

The deposited conductive metal is deposited into a previously deposited patterned insulator. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal chem.-mech polishing.

BRIEF DESCRIPTION OF THE DRAWINGS

The attached drawings include:

FIGS. 1A-1B, which in cross-sectional representation illustrate the first part of the method in a first embodiment of the present invention, the I-line (365 nm) sensitive resist coating and start of the via hole opening pattern definition.

FIGS. 2A-2B, which in cross-sectional representation illustrate the second part of the method in a second embodiment of the present invention, the deep-UW (248 nm) sensitive resist coating and start of the trench or line opening pattern definition.

DESCRIPTION OF THE PREFERRED EMBODIMENTS

Figure 2B:
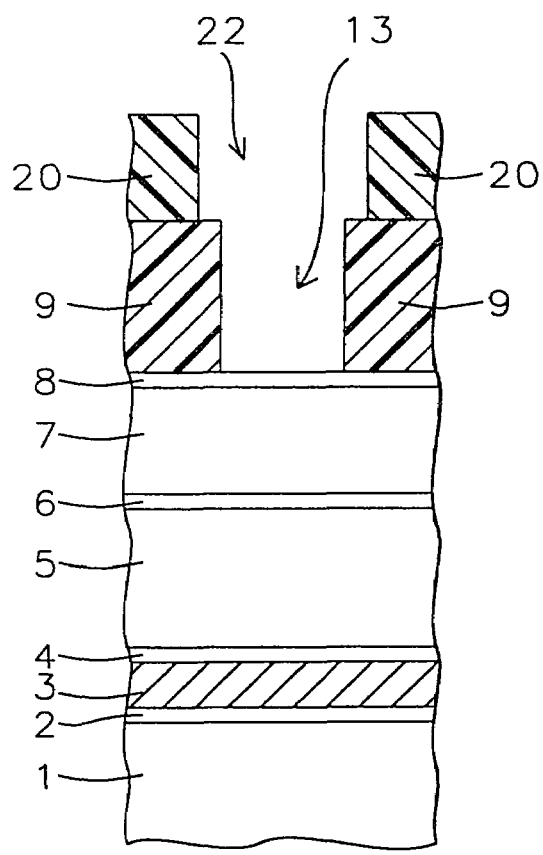

In general, the use of a "high contrast" positive photoresist system has been developed that responds over a narrow range of exposure intensity, to eliminate blurred edges of the pattern, and the resist system exposure sensitivity is optimized for wavelengths, deep-UV (248 nm) for the top layer of resist, the trench pattern, and I-line (365 nm) for the bottom layer of resist, the via pattern. The resist system provides a process in dual damascene for trench/via formation and has the following properties: selective etch resistance, thermal stability during processing, ease of processing and developing, and good adhesion properties. There are many ways for UV-sensitive polymer systems to cross-link, degrade, or undergo molecular rearrangement when irradiated. The selective irradiated area or exposed area become soluable, relative to the unexposed region, for this positive resist system.

Referring to FIG. 1A, which in cross-sectional representation, a semiconductor silicon substrate 1 includes an interval dielectric (ILD) layer 2 with the first level of metal copper wiring 3 being defined, embedded in the a layer of insulator. The first embodiment of the present invention starts with these layers in place. Next, a silicon nitride etch stop layer 4 is deposited on the metal copper wiring layer 3. Next, a low dielectric constant layer 5 is deposited over the passivation layer 4. Another silicon nitride etch stop layer 6, an intermediate etch stop layer, is deposited in a thickness from approximately 200 to 500 Angstroms, over the first low dielectric constant layer 5. Another low dielectric constant layer 7 is deposited over the silicon nitride etch stop layer 6 and a passivating, top insulating layer, anti-reflective coating (ARC) of silicon oxynitride 8, thickness approximately 300 to 1000 Angstroms, is placed over the second low dielectric constant layer 7.

As sketched in FIG. 1A, the composite layers of insulation are low dielectric constant dielectric material which are selected from the group consisting of $SiOF_x$, $SiOC_x$, $SiOH_x$, in a thickness from approximately 4000 to 1200 Angstroms for the first layer of dielectric (5), and in a thickness from approximately 4000 to 8000 Angstroms for the second layer of dielectric (7).

Again, referring to FIG. 1A, firstly, a layer of positive photoresist 9, which is sensitive to only I-line (365 nm) radiation, termed PR1 for reference, is coated on top of the silicon oxynitride 8 layer. This layer of photoresist 9 is then exposed to I-line radiation 10 and developed using a mask 11 that patterns the contact via hole opening, in the exposed resist 12. Referring to FIG. 1B, the patterned photoresist 9 with contact via hole opening 13.

Referring to FIG. 2A, which in cross-sectional representation shows a second embodiment of this invention. Another layer of photoresist positive resist 20, sensitive to deep-UV (248 nm), termed PR2 for reference, is coated on top of the via patterned first layer of resist 9, termed PR1. This second layer of photoresist 20 is then exposed to deep-UV (23) and developed using a mask 21 that patterns the trench or line opening 22. This second resist process does not affect the exposed and developed bottom layer of resist 9, which is only sensitive to I-line (365 nm) radiation.

Referring to FIG. 2B, the patterned photoresist 20 with trench or line opening 22 patterned. Thus, trench line pattern 22 and via hole pattern 13, patterned in the two layers of resist, are formed. These patterns in subsequent etch steps are transferred into the composite layers of insulation by a two-step, selective reactive ion etch process.

The two photoresists that are used, termed PR1 and PR1, are both positive resists and are chemical amplification resists (CAR) with photo acid generator (PAG) component. For PR1, there is a hardening bake of between 100 to approximately 200° C. The developer for both resists is TMAH. PR1 resist thickness is between approximately 6,000 to 10,000 Angstroms and is exposed to between approximately 150 to 500 milli Joules of light energy. PR2 resist thickness is between approximately 5,000 to 10,000 Angstroms and is exposed to between approximately 10 to 20 milli Joules of light energy. An anti-reflective coating of either SiON (inorganic) or an organic material is used an optional process step, underneath the PR1 resist. The layer thickness for the ARC is approximately from 200 to 1500 Angstroms.

Figure 3A:
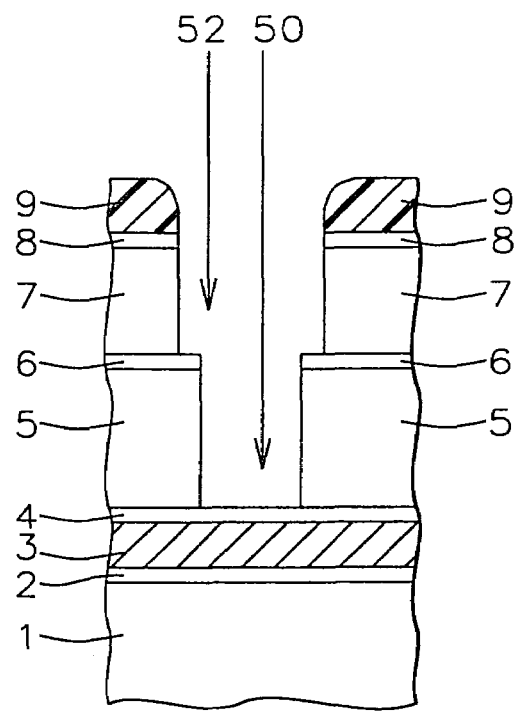
FIGS. 3A-3B, which in cross-sectional representation illustrate the fine part of embodiments of the present invention, the end result of the two-step etching process showing the final dual damascene trench or line opening and contact via hole opening, for subsequent inlaid metal fill.
Figure 3B:
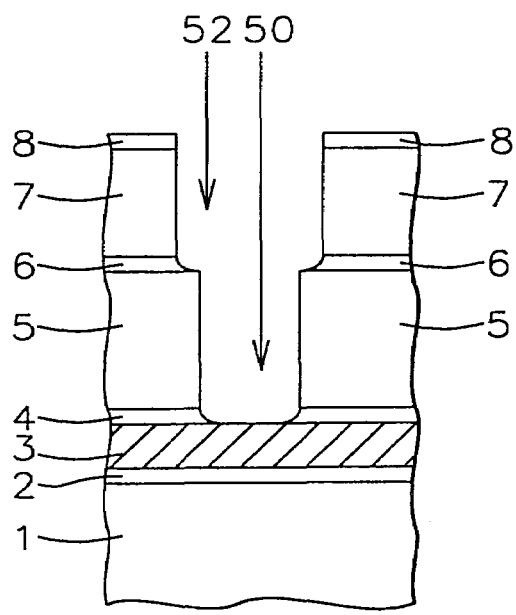

Referring to FIGS. 3A-3B, the remaining photoresist shown (9, FIG. 3A), is subsequently stripped away by ashing, as shown in FIG. 3B. As shown in FIG. 2B, thus is formed trench line opening 50 and via hole opening 52 for a dual damascene process. Note that in etching the trench and via openings, the photoresist also become partially consumed during the etching.

Referring to FIG. 3A, the resist patterns that were formed and shown in FIG. 2B, for trench and via, are transferred or replicated into the composite layers of insulation by a two-step, selective reactive ion etch process. Details of the two-step, selective reactive ion etch process are as follows. As shown in FIG. 3A, the following is a list of the various layers of insulator that are etched by this two-step, selective reaction ion etch process, etching down through: (8) the top SiON layer, the second layer of dielectric (7) underlying the first layer of photoresist (9), the intermediate layer of dielectric (6) under second layer of dielectric (7). Further, etching the composite layer of insulation transferring said trench line pattern into the first layer of photoresist (9) and into the second layer of dielectric (7) and transferring said via hole pattern into the intermediate layer of dielectric (6) and into the first layer of dielectric (5).

Details of the two-step, selective reactive ion etch process chemistry are as follows, to form dual damascene structure. The first step of process chemistry is as follows: for SiON and SiN etch $CHF_3$, $C_2F_6$, $N_2$ $O_2$ Ar, between 500 to 1200 Watts power, producing etch removal rates of between 1000 to 5000 Angstroms per minute. As part of the first step, the follow process chemistry is also applied: CO, $C_4F_8$, $C_2F_6$, Ar.

After the photoresist layers are stripped away by ashing and any remaining etch stop material (4), which is SiN or SiC, is removed by a second step of etching (as shown in FIG. 3B). The dual damascene structure is now ready for subsequent metal fill, forming metal line and contact via hole interconnections on the semiconductor substrate. The subsequent dual damascene processing steps include: deposition of copper metal with removal of the excess copper by chemical mechanical polish (CMP), thus forming inlaid copper interconnects and contact vias.

Details of the second step of etching to remove any SiN in the via are as follows. For via bottom opening, the following selective reactive ion etch process chemistry is used: $CF_4$, Ar $O_2$, $CH_3F$, between from 200 to 300 Watts power, producing etch rates from 1000 to 2000 Angstroms per minute.

While the invention has been particularly shown and described with reference to the preferred embodiments thereof, it will be understood by those skilled in the art that various changes in form and details may be made without departing from the spirit and scope of the invention.

What is claimed is:

1. A method of photoresist processing on a substrate over which is formed composite layers of insulation comprising a first layer of dielectric and a second layer of dielectric, the method comprising:
    forming a first photoresist layer over said composite layers of insulation;
    patterning a via hole pattern in said first photoresist layer by exposing to radiation of a first sensitivity;
    forming a second photoresist layer over via patterned and said first photoresist layer;
    patterning a trench line pattern in second photoresist layer by exposing to radiation of a second sensitivity;
    etching said second layer of dielectric underlying first layer of photoresist using the via hole pattern layer;
    etching said composite layer of insulation, thereby transferring said trench line pattern into said second layer of dielectric and transferring said via hole pattern into said first layer of dielectric; and
    filling the trench line and via hole openings with metal.

2. The method of claim 1, wherein the first photoresist layer is not sensitive to deep UV radiation and the second photoresist layer is sensitive to deep UV radiation.

3. The method of claim 1, wherein said composite layers of insulation are low dielectric constant dielectric material which are selected from the group consisting of $SiOF_x$, $SiOC_x$, $SiOH_x$, in a thickness from approximately 4000 to 1200 Angstroms for said first layer of dielectric and in a thickness from approximately 4000 to 8000 Angstroms for said second layer of dielectric.

4. The method of claim 1, wherein said composite layers of insulation include an intermediate etch stop layer of dielectric selected from the group consisting of silicon nitride, $Si_xN_y$, in a thickness from approximately 200 to 500 Angstroms, and which can be used in tandem with another etch stop layer or without said etch stop layers.

5. The method of claim 1, further comprising a top insulating layer over the composite layers of insulation, the top dielectric layer includes silicon oxynitride, SiON, in a thickness from approximately 300 to 1000 Angstroms.

6. The method of claim 1, wherein said first photoresist layer is positive type photoresist selected from the group consisting of I-line positive results, in a thickness from approximately 6000 to 10000 Angstroms and is selectively sensitive to and exposed to ultraviolet light I-line radiation of wavelength 365 nm.

7. The method of claim 1, wherein said second photoresist layer is positive type photoresist selected from the group consisting of positive DUV, 248 nm photoresist, in a thickness from approximately 5000 to 10000 Angstroms and is selectively sensitive to and exposed to ultraviolet light deep-UV radiation of wavelength 248 nm.

8. The method of claim 1, wherein said etching is performed in a two-step etch, selective reactive ion etch, RIE, with the first step process chemistry, for etching SiON and SiN: $CHF_3$, $C_2F_6$, $N_2O_2Ar$, between 500 to 1200 Watts power, producing etch removal rates of between 1000 to 5000 Angstroms per minute, next applying: CO, $C_4F_8$, $C_2F_6$, Ar; the second step of etching to removing any SiN in the via: $CF_4$, Ar $O_2$, $CH_3F$, between from 200 to 300 Watts power, producing etch rates from 1000 to 2000 Angtroms per minute, this both the trench and via openings are formed in a dual damascene process.

9. The method of claim 1, wherein the dual damascene trench/via is lined with a diffusion barrier, filled with conducting metal and whereby the excess metal is removed by chemical mechanical polish.

10. The method of claim 1, wherein multilevel conducting layers are fabricated by repeating the process steps described in the method of claim 1.

11. A method of dual damascene patterning by use of two-layered photoresist process, having different wavelength sensitivities for each layer, comprising:

providing a substrate over which is formed composite layers of insulation wherein said composite layers comprise a first layer of dielectric separated from a second layer of dielectric by an intermediate etch stop layer of dielectric;

forming a first photoresist layer over said composite layers of insulation;

patterning a via hole pattern in said first photoresist layer composed by exposing to radiation of a first sensitivity and developing said first photoresist layer by using a via hole mask;

forming a second photoresist layer over said first photoresist layer;

patterning a trench line pattern in said second photoresist layer by exposing to radiation of a second sensitivity and developing said second photoresist layer by using a trench line mask;

etching, in two-step process, said second layer of dielectric underlying said first layer of photoresist and transferring said via hole pattern into said second layer of dielectric;

etching said intermediate etch stop layer of dielectric under said second layer of dielectric and transferring said via hole pattern in said layer of photoresist into said intermediate etch stop layer of dielectric;

etching said composite layer of insulation transferring said trench line pattern into said first layer of photoresist and into said second layer of dielectric to form a trench line opening, and at the same time transferring said via hole pattern into said intermediate etch stop layer of dielectric and into said first layer of dielectric to form a via hole opening;

removing said layers of photoresist and any exposed insulating material in the trench line opening and via hole opening;

depositing metal into the trench line and via hole opening with subsequent removal of excess metal by chemical mechanical polishing back, to form inlaid conducting interconnects lines and contact vias, in a dual damascene process.

12. The method of claim 11, wherein said substrate is semiconductor single crystal silicon or an IC module.

13. The method of claim 11, wherein said composite layers of insulation are low dielectric constant dielectric material which are selected from the group consisting of $SiOF_x$, $SiOC_x$, $SiOH_x$, in a thickness from approximately 4000 to 1200 Angstroms for said first layer of dielectric and in a thickness from approximately 4000 to 8000 Angstroms for said second layer of dielectric.

14. The method of claim 11, wherein said intermediate etch stop layer of dielectric is selected from the group consisting of silicon nitride, $Si_xN_y$, in a thickness from approximately 200 to 500 Angstroms, and can be used in tandem with another etch stop layer.

15. The method of claim 11, wherein said second layer of dielectric is silicon oxynitride, SiON, in a thickness from approximately 300 to 1000 Angstroms.

16. The method of claim 11, wherein said first photoresist layer is positive type photoresist selected from the group consisting of I-line positive resists, in a thickness from approximately 6000 to 10000 Angstroms and is selectively sensitive to and exposed to ultraviolet light I-line radiation of wavelength 365 nm.

17. The method of claim 11, wherein said second photoresist layer is positive type photoresist selected from the group consisting of positive DUV, 248 nm photoresist, in a thickness from approximately 5000 to 10000 Angstroms and is selectively sensitive to and exposed to ultraviolet light deep-UV radiation of wavelength 248 nm.

18. The method of claim 11, wherein said etching is performed in a two-step etch, selective reactive ion etch, RIE, with the first step process chemistry, for etching SiON and SiN: $CHF_3$, $C_2F_6$, $N_2O_2$ Ar, between 500 to 1200 Watts power, producing etch removal rates of between 1000 to 5000 Angstroms per minute, next applying: CO, $C_4F_8$, $C_2F_6$, Ar; the second step of etching to removing any SiN in the via: $CF_4$, Ar $O_2$, $CH_3F$, between from 200 to 300 Watts power, producing etch rates from 1000 to 2000 Angstroms per minute, thus both the trench and via openings are formed in a dual damascene process.

19. The method of claim 11, wherein the dual damascene trench/via is lined with a diffusion barrier, filled with conducting metal and whereby the excess metal is removed by chemical mechanical polish.

20. A method for patterning in a semiconductor wafer having a dielectric layer with a lower portion and an upper portion over the lower portion, the method comprising:

providing a first photoresist layer over the upper dielectric layer portion, the first photoresist layer sensitive to first radiation;

patterning and developing a via hole in the first photoresist layer using the first radiation;

providing a second photoresist layer over the patterned and developed first photoresist layer, the second photoresist layer filling the via hole and being sensitive to a second radiation;

patterning and developing the second photoresist layer to form a trench over the filled via hole, using the second radiation;

etching the upper and lower dielectric layer portions to form a trench pattern in the upper dielectric layer portion that corresponds to the trench pattern formed in the second photoresist layer and a via hole pattern in the lower dielectric layer portion that corresponds to the via hole in the first photoresist layer.

* * * * *

UNITED STATES PATENT AND TRADEMARK OFFICE
CERTIFICATE OF CORRECTION

PATENT NO.         : 7,364,836 B2
APPLICATION NO. : 11/193901
DATED              : April 29, 2008
INVENTOR(S)        : Chung-Shi Liu and Chih-Cheng Lin It is certified that error appears in the above-identified patent and that said Letters Patent is hereby corrected as shown below:

Column 1, Line 59, should be corrected from: "deep-UW" to --deep-UV--

Column 3, Line 1, should be corrected from: "termed PR1 and PR1" to --termed PR1 and PR2--

Signed and Sealed this

Fifteenth Day of July, 2008

JON W. DUDAS
*Director of the United States Patent and Trademark Office*